(12) United States Patent  (10) Patent No.: US 12,315,286 B2
Araki et al.  (45) Date of Patent: May 27, 2025

(54) DETECTION DEVICE

(71) Applicant: Japan Display Inc., Tokyo (JP)

(72) Inventors: Shigesumi Araki, Tokyo (JP); Kazuki Matsunaga, Tokyo (JP); Akio Takimoto, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 18/659,213

(22) Filed: May 9, 2024

(65) Prior Publication Data

US 2024/0290134 A1  Aug. 29, 2024

Related U.S. Application Data

(63) Continuation of application No. PCT/JP2022/042116, filed on Nov. 11, 2022.

(30) Foreign Application Priority Data

Nov. 12, 2021  (JP) ................................. 2021-185214

(51) Int. Cl.
*G06V 40/12*  (2022.01)
*G06V 40/13*  (2022.01)
(Continued)

(52) U.S. Cl.
CPC ....... *G06V 40/1318* (2022.01); *H10F 39/198* (2025.01); *H10F 39/806* (2025.01)

(58) Field of Classification Search
CPC . G06V 40/1318; H10F 39/198; H10F 39/806; H10F 55/00; H10F 39/12
See application file for complete search history.

(56) References Cited

U.S. PATENT DOCUMENTS

2007/0210242 A1  9/2007  Cho
2009/0016578 A1  1/2009  Yamamoto et al.
(Continued)

FOREIGN PATENT DOCUMENTS

CN  108021845 A  5/2018
CN  109271834 A  1/2019
(Continued)

OTHER PUBLICATIONS

Search Report issued in related International Patent Application No. PCT/JP2022/042116 mailed on Dec. 27, 2022 and English translation of same. 8 pages.
(Continued)

*Primary Examiner* — Tony Ko
(74) *Attorney, Agent, or Firm* — K&L Gates LLP

(57) ABSTRACT

According to an aspect, a detection device includes: a photosensor including light-receiving elements; a front light including a light guide plate and a light source configured to emit light to a first side surface of the light guide plate; and an optical filter layer provided between the light-receiving elements and the front light. The optical filter layer includes light guide paths and a light-blocking portion. A first opening of each light guide path closest to the light-receiving elements is offset in a direction more away from the light source than a second opening of the light guide path farthest from the light-receiving elements. The light guide plate includes a scattering portion on the optical filter layer side. A first peak of an intensity of first light emitted from the detection surface of the light guide plate is observed to be tilted toward a side opposite to the first side surface.

11 Claims, 14 Drawing Sheets

(51) Int. Cl.
    *H10F 39/00*     (2025.01)
    *H10F 39/12*     (2025.01)

(56) References Cited

U.S. PATENT DOCUMENTS

| | | |
|---|---|---|
| 2012/0085890 A1 | 4/2012 | Kurokawa |
| 2018/0349673 A1 | 12/2018 | Lin et al. |
| 2018/0373945 A1 | 12/2018 | Wu et al. |
| 2019/0120763 A1 | 4/2019 | Wu et al. |
| 2020/0234026 A1* | 7/2020 | Du .................. G06V 40/1312 |
| 2021/0011578 A1 | 1/2021 | Zhang et al. |
| 2023/0051655 A1 | 2/2023 | Someya et al. |

FOREIGN PATENT DOCUMENTS

| | | |
|---|---|---|
| JP | H11-120324 A | 4/1999 |
| JP | 2002-117393 A | 4/2002 |
| JP | 2009-017943 A | 1/2009 |
| JP | 2009-172263 A | 8/2009 |
| JP | 2012-223414 A | 11/2012 |
| JP | 2019-045503 A | 3/2019 |
| JP | 2021-105949 A | 7/2021 |

OTHER PUBLICATIONS

Written Opinion issued in related International Patent Application No. PCT/JP2022/042116 mailed on Dec. 27, 2022. 5 pages.
Office Action issued in corresponding Japanese Patent Application No. 2023-559929, issued on Feb. 12, 2025 and English translation of same. 10 pages.

\* cited by examiner

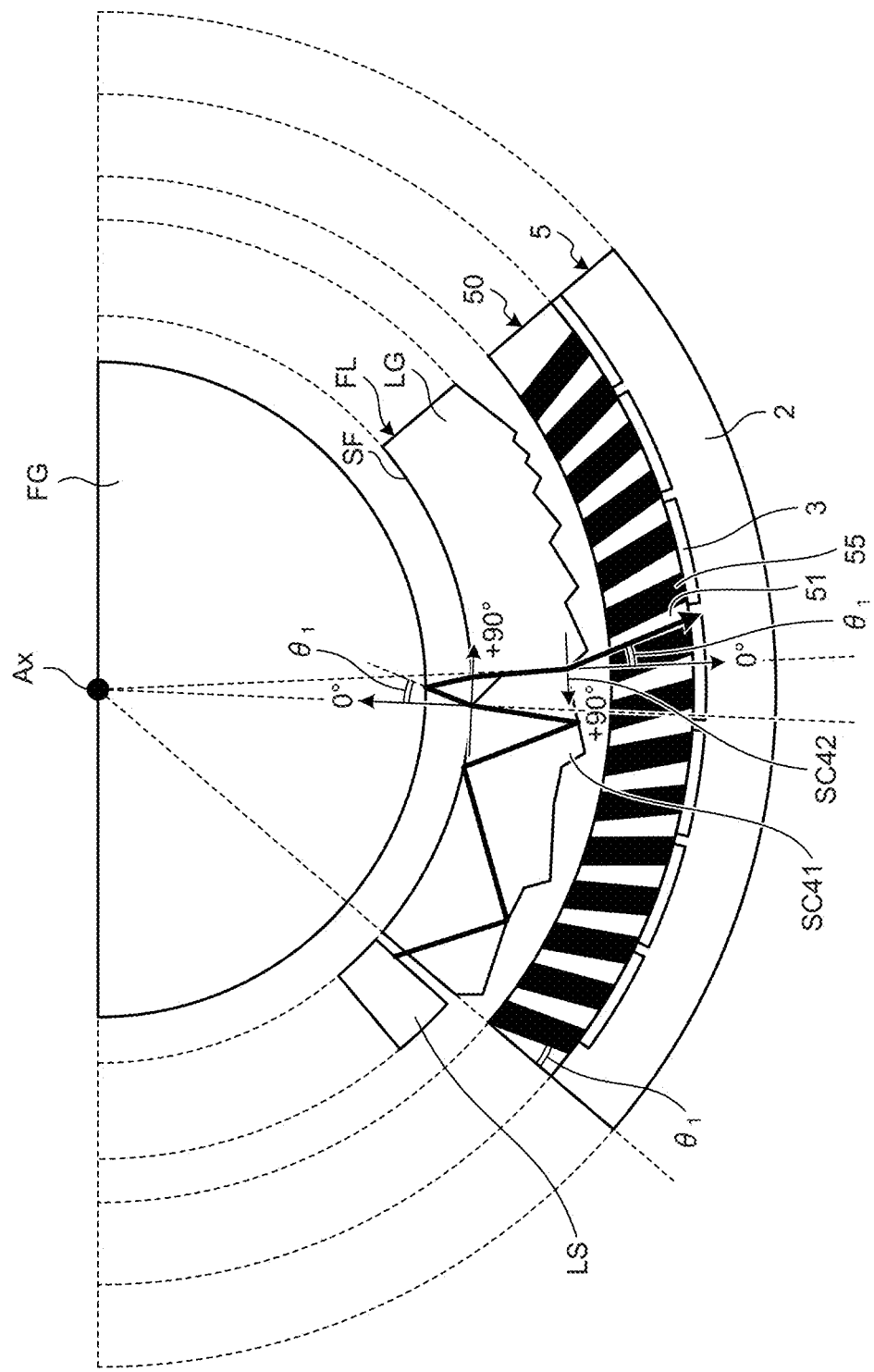

DETECTION DEVICE

CROSS-REFERENCE TO RELATED APPLICATION

This application claims the benefit of priority from Japanese Patent Application No. 2021-185214 filed on Nov. 12, 2021 and International Patent Application No. PCT/JP2022/042116 filed on Nov. 11, 2022, the entire contents of which are incorporated herein by reference.

BACKGROUND

1. Technical Field

What is disclosed herein relates to a detection device.

2. Description of the Related Art

In recent years, optical sensors have been known as sensors used for personal authentication and the like (for example, Japanese Patent Application Laid-open Publication No. 2019-045503 (JP-A-2019-045503)). The optical sensors each include a light-receiving element that outputs a signal that changes with an amount of received light. In a sensor described in JP-A-2019-045503, a plurality of light-receiving elements such as photodiodes are arranged on a substrate. In order for the light-receiving elements to receive an appropriate amount of light, illumination is required to illuminate an object to be detected. The object to be detected can be illuminated by disposing a light guide plate on the front side of the light-receiving elements (for example, JP-A-2019-045503 and Japanese Patent Application Laid-open Publication No. H11-120324 (JP-A-H11-120324)).

Optical detection devices described in JP-A-2019-045503 and JP-A-H11-120324 need to guide light reflected from the object to be detected to the light-receiving elements. However, light that travels in the direction opposite to the direction toward the object to be detected and is directly incident on the light-receiving element leads to a reduction in contrast. In the optical detection devices, there is room for improvement in guiding the light reflected from the object to be detected to the light-receiving elements.

For the foregoing reasons, there is a need for a detection device with a front light that can increase detection accuracy.

SUMMARY

According to an aspect, a detection device includes: a photosensor including a plurality of light-receiving elements configured to receive light; a front light that is disposed on a side of an object to be detected with respect to the photosensor and includes a light guide plate and a light source configured to emit light to a first side surface of the light guide plate; and an optical filter layer that is provided between the light-receiving elements and the front light. The optical filter layer includes light guide paths that at least partially overlap the light-receiving elements and a light-blocking portion that has higher absorptance of the light than the light guide paths. When viewed from a detection surface of the light guide plate facing the object to be detected, a first opening of each of the light guide paths closest to the light-receiving elements is offset in a direction more away from the light source than a second opening of the light guide path farthest from the light-receiving elements. The light guide plate includes a scattering portion configured to scatter the light from the light source on the optical filter layer side. When viewed in a normal direction to the detection surface of the light guide plate, a first peak of an intensity of first light emitted from the detection surface of the light guide plate is observed to be tilted toward a side opposite to the first side surface.

BRIEF DESCRIPTION OF THE DRAWINGS

FIG. 21 is a sectional view schematically illustrating a section of the detection device according to the third embodiment.

DETAILED DESCRIPTION

Figure 1:
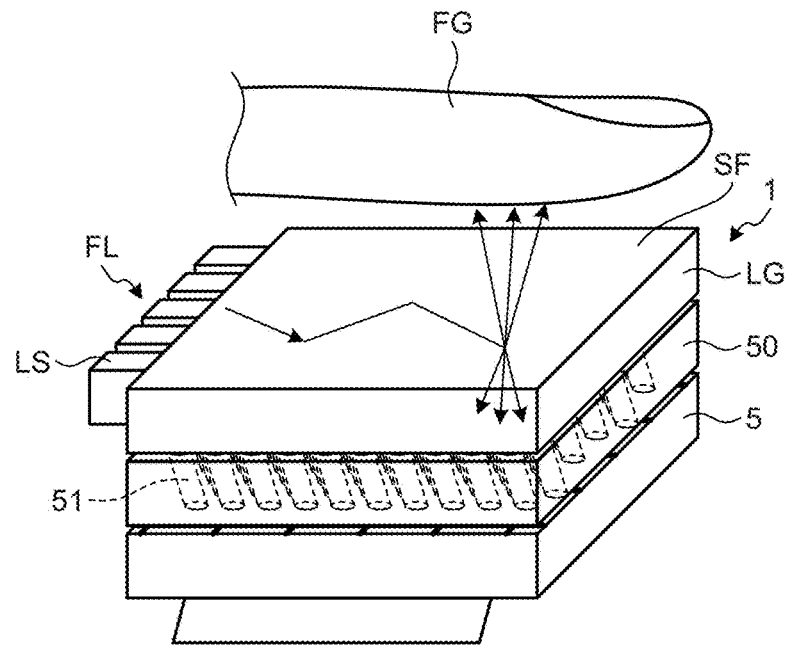
FIG. 1 is a perspective view schematically illustrating a detection device according to a first embodiment of the present disclosure.

The following describes modes (embodiments) for carrying out the present disclosure in detail with reference to the drawings. The present disclosure is not limited to the description of the embodiments given below. Components described below include those easily conceivable by those skilled in the art or those substantially identical thereto. In addition, the components described below can be combined as appropriate. What is disclosed herein is merely an example, and the present disclosure naturally encompasses appropriate modifications easily conceivable by those skilled in the art while maintaining the gist of the present invention. To further clarify the description, the drawings may schematically illustrate, for example, widths, thicknesses, and shapes of various parts as compared with actual aspects thereof. However, they are merely examples, and interpretation of the present disclosure is not limited thereto. The same element as that illustrated in a drawing that has already been discussed is denoted by the same reference numeral through the description and the drawings, and detailed description thereof may not be repeated where appropriate.

In embodiments of the present disclosure, in expressing an aspect of disposing another structure on or above a certain structure, a case of simply expressing "on" includes both a case of disposing the other structure immediately on the certain structure so as to contact the certain structure and a case of disposing the other structure above the certain structure with still another structure interposed therebetween, unless otherwise specified.

First Embodiment

Figure 2:
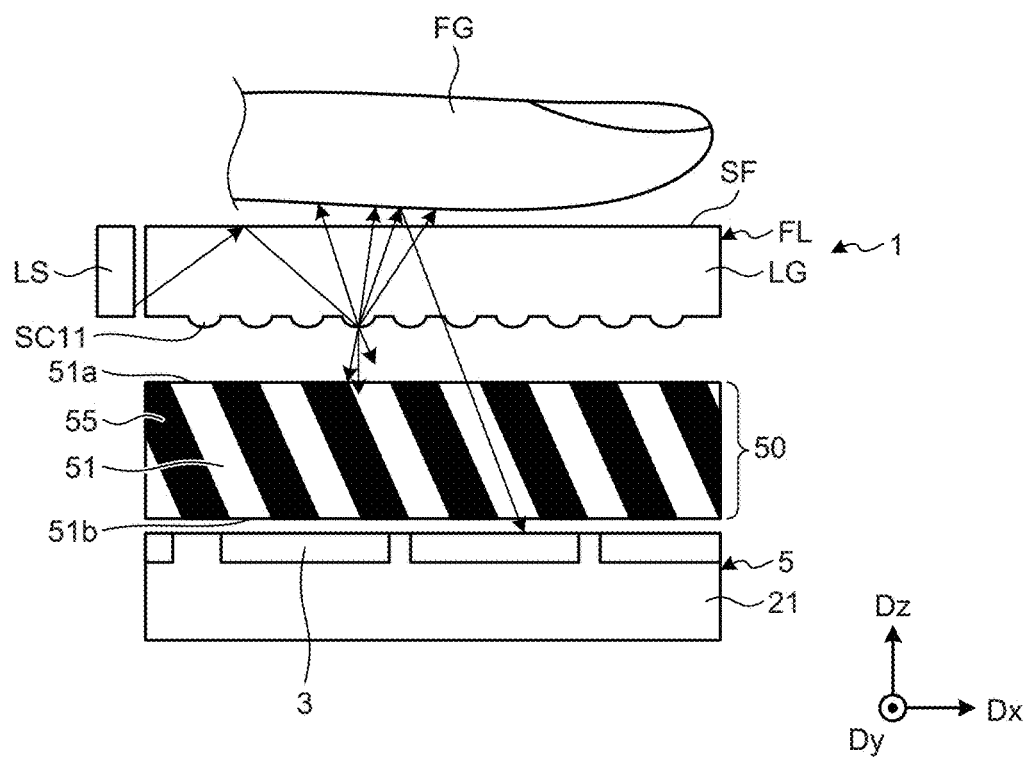
FIG. 2 is a sectional view schematically illustrating a section of the detection device according to the first embodiment.

FIG. 1 is a perspective view schematically illustrating a detection device according to a first embodiment of the present disclosure. FIG. 2 is a sectional view schematically illustrating a section of the detection device according to the first embodiment. As illustrated in FIG. 1, a detection device 1 includes an optical sensor 5, an optical filter layer 50, and a front light FL. The front light FL includes a light-transmitting light guide plate LG and a light source LS facing a side surface of the light guide plate LG. The optical filter layer 50 and the front light FL are bonded together with an optical resin therebetween, which is not illustrated. A space may be provided between the optical filter layer 50 and the front light FL.

The light source LS is, for example, a light-emitting diode (LED) that emits red light or infrared light, but the color is not limited to these colors, and can be changed to, for example, green as appropriate depending on measurement items. A plurality of the LEDs of the light source LS are arranged along the side surface of the light guide plate LG.

As illustrated in FIG. 2, the optical sensor 5 is located on an opposite side to a side of the front light FL facing an object to be detected, and the optical sensor 5 overlaps a detection surface SF of the light guide plate LG as viewed from an object to be detected FG side of the light guide plate LG. A scattering portion SC11 is located on the opposite side to the detection surface SF of the light guide plate LG. The scattering portion SC11 is a dot-shaped projecting or recessed portion. The scattering portion SC11 may be a groove. Light propagating in the light guide plate LG is scattered by the scattering portion SC11. Part of the light scattered by the scattering portion SC11 is emitted from the detection surface SF of the light guide plate LG to the object to be detected FG. Part of the light transmitted or reflected by the object to be detected FG returns to the light guide plate LG, and is emitted from a back surface of the light guide plate LG opposite to the detection surface SF. As a result, the optical sensor 5 can detect information on the object to be detected FG using the light emitted from the light source LS.

As illustrated in FIG. 2, the optical sensor 5 includes a substrate 21 and a light-receiving element 3. The light-receiving element 3 detects the light from the object to be detected FG. Specifically, when the light from the light source LS reaches the object to be detected FG, the light transmits through or reflects on the object to be detected FG, and the light enters the optical filter layer 50. The light enters the light-receiving element 3 through the optical filter layer 50. As a result, the optical sensor 5 can detect the light. The object to be detected FG is, for example, a finger, a palm, or a wrist. For example, the optical sensor 5 can detect information on, for example, a fingerprint of the object to be detected FG based on the light. The optical sensor 5 may also detect various types of information (biometric information) such as shapes of blood vessels, pulsation, and pulse waves.

The optical filter layer 50 is an optical element that transmits some components of the light reflected by an object to be detected, such as the object to be detected FG, toward a photodiode 30 and attenuates the other components thereof traveling in other directions. Specifically, the optical filter layer 50 transmits components that travel in a direction tilted in a predetermined direction with respect to a third direction Dz. The optical filter layer 50 is also called collimating apertures or a collimator. The optical filter layer 50 is provided on the object to be detected FG side of the light-receiving element 3, and faces the light-receiving element 3. The optical filter layer 50 includes a plurality of light guide paths 51 and a light-blocking portion 55 provided around the light guide paths 51.

Figure 3:
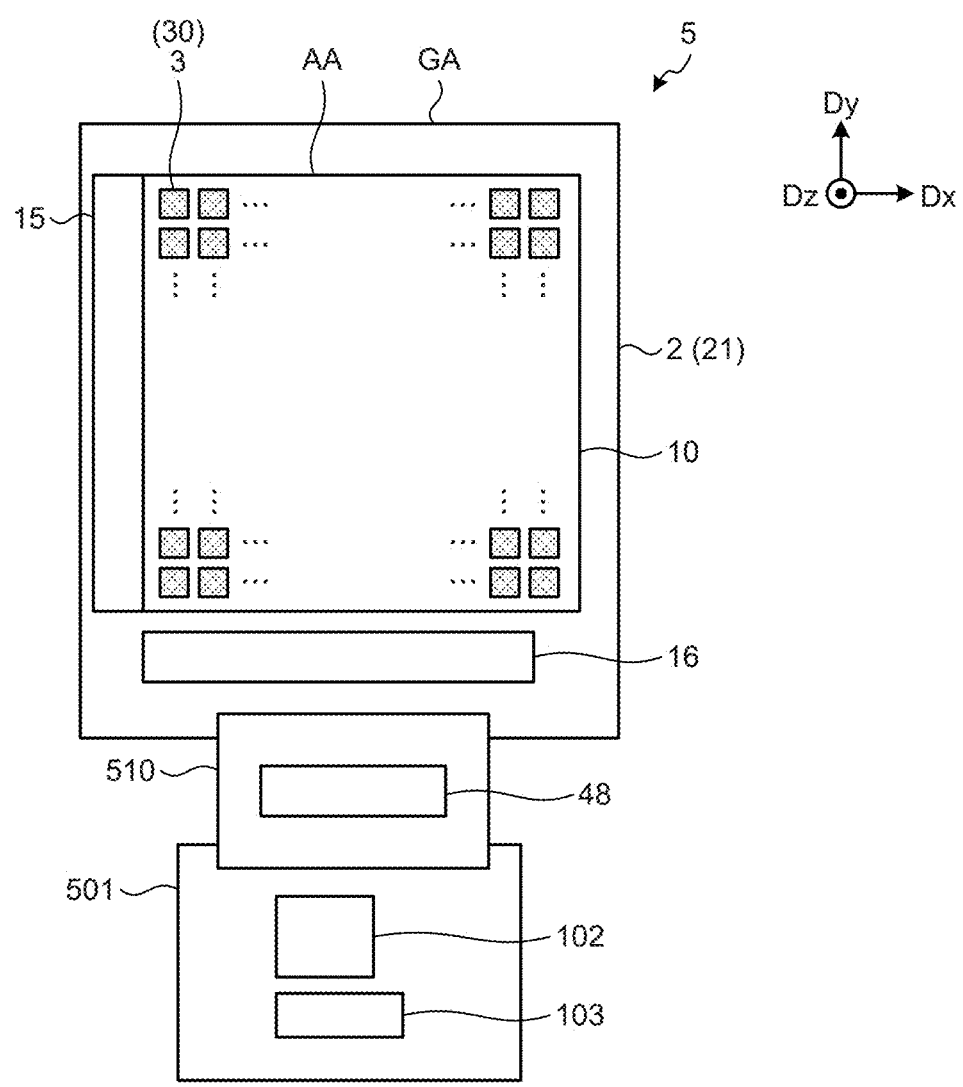
FIG. 3 is a plan view schematically illustrating the detection device according to the first embodiment.

FIG. 3 is a plan view schematically illustrating the detection device according to the first embodiment. As illustrated in FIG. 3, the optical sensor 5 includes a light-receiving element array substrate 2 (substrate 21), the light-receiving elements 3, a scan line drive circuit 15, a signal line selection circuit 16, a detection circuit 48, a control circuit 102, and a power supply circuit 103.

The substrate 21 is electrically coupled to a control substrate 501 through a wiring substrate 510. The wiring substrate 510 is, for example, a flexible printed circuit board or a rigid circuit board. The wiring substrate 510 is provided with the detection circuit 48. The control substrate 501 is provided with the control circuit 102 and the power supply circuit 103. The control circuit 102 is, for example, a field-programmable gate array (FPGA). The control circuit 102 supplies control signals to a sensor 10, the scan line drive circuit 15, and the signal line selection circuit 16 to control detection operations of the sensor 10. The power supply circuit 103 supplies voltage signals including, for example, a power supply potential SVS and a reference potential VR1 (refer to FIG. 5) to the sensor 10, the scan line drive circuit 15, and the signal line selection circuit 16. While the first embodiment illustrates the case of disposing the detection circuit 48 on the wiring substrate 510, the present disclosure is not limited to this case. The detection circuit 48 may be disposed on the substrate 21.

The substrate 21 has a detection area AA and a peripheral area GA. The detection area AA is an area provided with a plurality of the light-receiving elements 3 included in the sensor 10. The peripheral area GA is an area outside the detection area AA and is an area where no light-receiving element 3 is provided. That is, the peripheral area GA is an area between the outer perimeter of the detection area AA and outer edges of the substrate 21.

Each of the light-receiving elements 3 of the sensor 10 is a photosensor including the photodiode 30 as a sensor element. Each of the photodiodes 30 outputs an electrical signal corresponding to light emitted thereto. More specifically, the photodiode 30 is a positive-intrinsic-negative (PIN) photodiode or an organic photodiode (OPD) using an organic semiconductor. The light-receiving elements 3 are arranged in a matrix having a row-column configuration in the detection area AA. The photodiodes 30 included in the light-receiving elements 3 perform the detection in accordance with gate drive signals supplied from the scan line drive circuit 15. Each of the photodiodes 30 outputs the electrical signal corresponding to the light emitted thereto as a detection signal Vdet to the signal line selection circuit 16. The detection device 1 detects the information on the object to be detected FG based on the detection signals Vdet received from the photodiodes 30.

The scan line drive circuit 15 and the signal line selection circuit 16 are provided in the peripheral area GA. Specifically, the scan line drive circuit 15 is provided in an area extending along a second direction Dy in the peripheral area GA. The signal line selection circuit 16 is provided in an area extending along a first direction Dx in the peripheral area GA and is provided between the sensor 10 and the detection circuit 48.

The first direction Dx is one direction in a plane parallel to the substrate 21. The second direction Dy is one direction in the plane parallel to the substrate 21 and is a direction orthogonal to the first direction Dx. The second direction Dy may non-orthogonally intersect the first direction Dx. The third direction Dz is a direction orthogonal to the first direction Dx and the second direction Dy and is a direction normal to the substrate 21.

Figure 4:
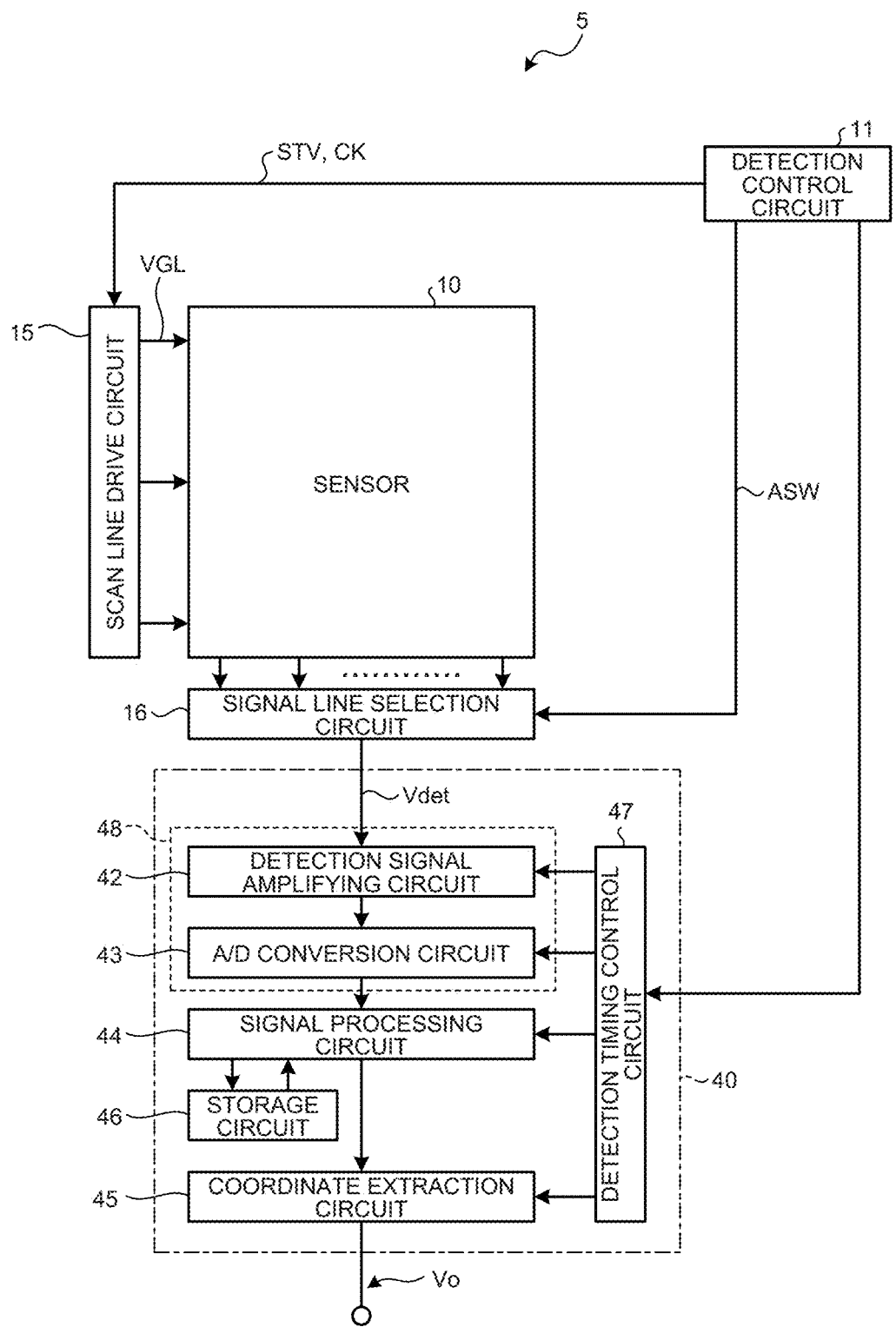
FIG. 4 is a block diagram illustrating a configuration example of the detection device according to the first embodiment.

FIG. 4 is a block diagram illustrating a configuration example of the detection device according to the first embodiment. As illustrated in FIG. 4, the detection device 1 further includes a detection control circuit 11 and a detector (detection processing circuit) 40. The control circuit 102 includes one, some, or all functions of the detection control circuit 11. The control circuit 102 also includes one, some, or all functions of the detector 40 other than those of the detection circuit 48.

The detection control circuit 11 is a circuit that supplies respective control signals to the scan line drive circuit 15, the signal line selection circuit 16, and the detector 40 to control operations of these components. The detection control circuit 11 supplies various control signals including, for example, a start signal STV and a clock signal CK to the scan line drive circuit 15. The detection control circuit 11 also supplies various control signals including, for example, a selection signal ASW to the signal line selection circuit 16.

The scan line drive circuit 15 is a circuit that drives a plurality of scan lines GLS (refer to FIG. 5) based on the various control signals. The scan line drive circuit 15 sequentially or simultaneously selects the scan lines GLS, and supplies gate drive signals VGL to the selected scan lines GLS. Through this operation, the scan line drive circuit 15 selects the photodiodes 30 coupled to the scan lines GLS.

Figure 5:
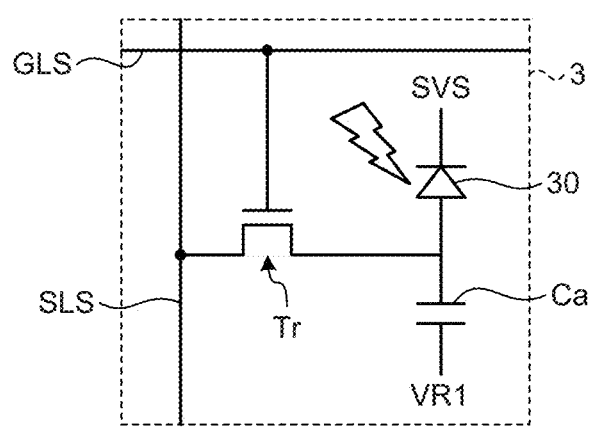
FIG. 5 is a circuit diagram of a light-receiving element.

The signal line selection circuit 16 is a switch circuit that sequentially or simultaneously selects a plurality of output signal lines SLS (refer to FIG. 5). The signal line selection circuit 16 is, for example, a multiplexer. The signal line selection circuit 16 couples the selected output signal lines SLS to the detection circuit 48 based on the selection signal ASW supplied from the detection control circuit 11. Through this operation, the signal line selection circuit 16 outputs the detection signals Vdet of the photodiodes 30 to the detector 40.

The detector 40 includes the detection circuit 48, a signal processing circuit 44, a coordinate extraction circuit 45, a storage circuit 46, and a detection timing control circuit 47. The detection timing control circuit 47 performs control to cause the detection circuit 48, the signal processing circuit 44, and the coordinate extraction circuit 45 to operate in synchronization with one another based on a control signal supplied from the detection control circuit 11.

The detection circuit 48 is, for example, an analog front-end (AFE) circuit. The detection circuit 48 is a signal processing circuit having functions of at least a detection signal amplifying circuit 42 and an analog-to-digital (A/D) conversion circuit 43. The detection signal amplifying circuit 42 is a circuit that amplifies the detection signal Vdet, and is, for example, an integration circuit. The A/D conversion circuit 43 converts analog signals output from the detection signal amplifying circuit 42 into digital signals.

The signal processing circuit 44 is a logic circuit that detects a predetermined physical quantity received by the sensor 10 based on output signals of the detection circuit 48. The signal processing circuit 44 can detect, based on the signals from the detection circuit 48, the information based on the light reflected by the object to be detected FG when the object to be detected FG is in contact with or in proximity to the detection surface SF (light guide plate LG). The signal processing circuit 44 can also extract other biological information such as the fingerprint, the pulse waves, the pulsation, and a blood oxygen saturation level based on the signals from the detection circuit 48.

The storage circuit 46 temporarily stores therein signals calculated by the signal processing circuit 44. The storage circuit 46 may be, for example, a random-access memory (RAM) or a register circuit.

The coordinate extraction circuit 45 is a logic circuit that obtains detected coordinates of the object to be detected FG (for example, detected positions of asperities on a surface of the finger or detected positions of the blood vessels of the palm or the wrist) when the contact or proximity of the object to be detected FG is detected by the signal processing circuit 44. The coordinate extraction circuit 45 combines the detection signals Vdet output from the respective light-receiving elements 3 of the sensor 10 to generate two-dimensional information indicating a shape of the asperities on the surface of the finger or a vascular image. The coordinate extraction circuit 45 may output the detection signals Vdet as sensor outputs Vo instead of calculating the detected coordinates.

The following describes a circuit configuration example of the optical sensor 5. FIG. 5 is a circuit diagram of the light-receiving element of the optical sensor 5. As illustrated in FIG. 5, the light-receiving element 3 includes the photodiode 30, a capacitive element Ca, and a first transistor Tr. The first transistor Tr is provided corresponding to the photodiode 30. The first transistor Tr is formed of a thin-film transistor, and in this example, formed of an n-channel metal oxide semiconductor (MOS) thin-film transistor (TFT). The gate of the first transistor Tr is coupled to a corresponding one of the scan lines GLS. The source of the first transistor Tr is coupled to a corresponding one of the output signal lines SLS. The drain of the first transistor Tr is coupled to the anode of the photodiode 30 and the capacitive element Ca.

The cathode of the photodiode 30 is supplied with the power supply potential SVS from the power supply circuit 103. The capacitive element Ca is supplied with the reference potential VR1 serving as an initial potential of the capacitive element Ca from the power supply circuit 103.

When the light-receiving element 3 is irradiated with light, a current corresponding to the amount of the light flows through the photodiode 30. As a result, an electric charge is stored in the capacitive element Ca. After the first transistor Tr is turned on, a current corresponding to the electric charge stored in the capacitive element Ca flows through the output signal line SLS. The output signal line SLS is coupled to the detection circuit 48 through the signal line selection circuit 16. Thus, the detection device 1 can detect a signal corresponding to the amount of the light applied to the photodiode 30 for each of the light-receiving elements 3.

While FIG. 5 illustrates one of the light-receiving elements 3, the scan line GLS and the output signal line SLS are coupled to a plurality of the light-receiving elements 3. Specifically, each of the scan lines GLS extends in the first direction Dx (refer to FIG. 2) and is coupled to the light-receiving elements 3 arranged in the first direction Dx. Each of the output signal lines SLS extends in the second direction Dy and is coupled to the light-receiving elements 3 arranged in the second direction Dy.

The first transistor Tr is not limited to the n-type TFT and may be configured as a p-type TFT. The light-receiving element 3 may be provided with a plurality of transistors corresponding to one photodiode 30.

Figure 6:
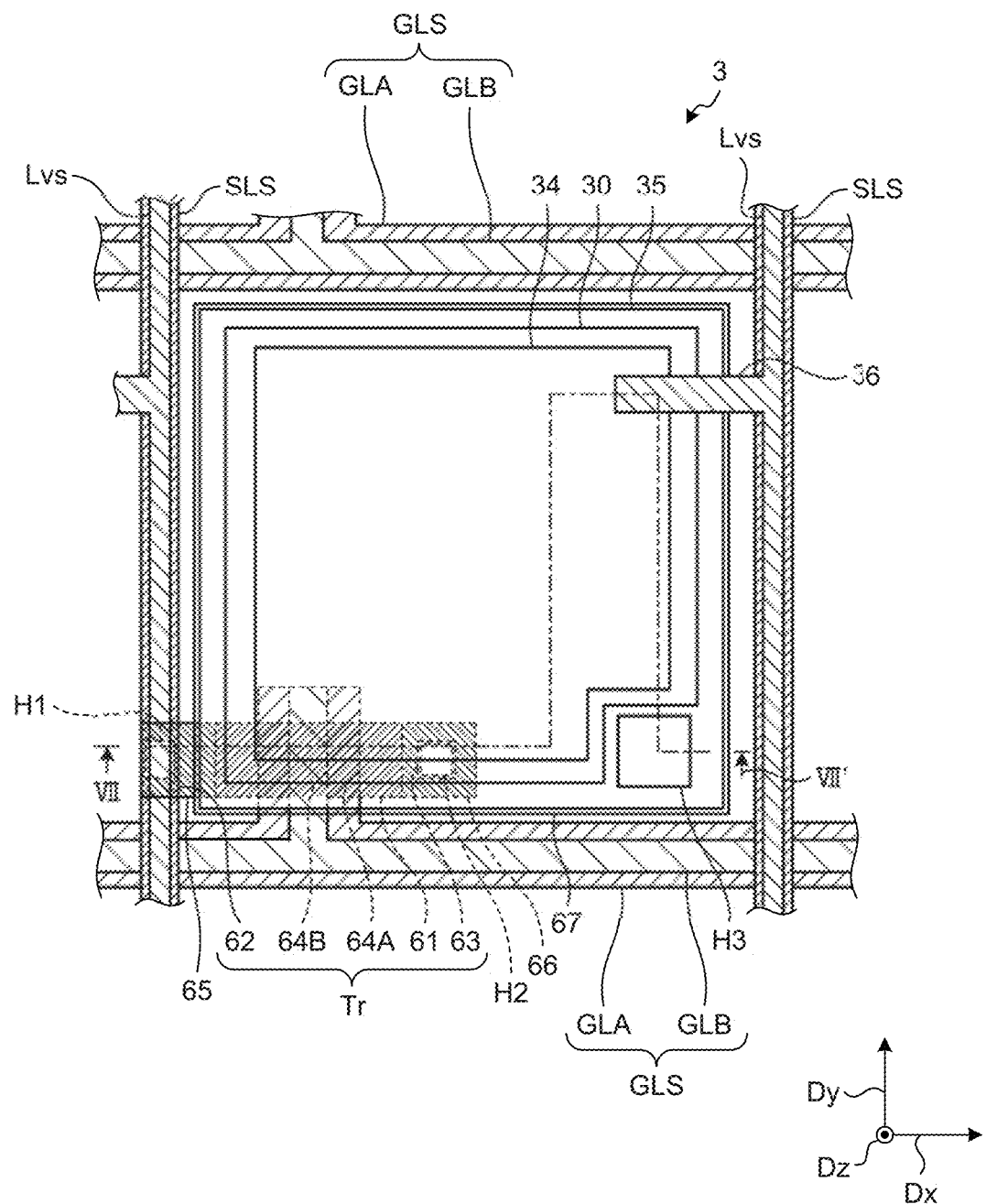
FIG. 6 is a plan view schematically illustrating the light-receiving element of the detection device according to the first embodiment.

The following describes a detailed circuit configuration of the detection device 1. FIG. 6 is a plan view schematically illustrating the light-receiving element of the detection device according to the first embodiment. As illustrated in FIG. 6, the light-receiving element 3 is an area surrounded by the scan lines GLS and the output signal lines SLS. In the first embodiment, the scan line GLS includes a first scan line GLA and a second scan line GLB. The first scan line GLA is provided so as to overlap the second scan GLB. The first and the second scan lines GLA and GLB are provided in different layers with insulating layers 22c and 22d interposed therebetween (refer to FIG. 7). The first and the second scan lines GLA and GLB are electrically coupled together at any point and are supplied with the gate drive signals VGL having the same potential. The first scan lines GLA, the second scan lines GLB, or both are coupled to the scan line drive circuit 15. In FIG. 6, the first scan line GLA and the second scan line GLB have different widths, but may have the same width.

The photodiode 30 is provided in the area surrounded by the scan lines GLS and the output signal lines SLS. The photodiode 30 includes a semiconductor layer 31, an upper electrode 34, and a lower electrode 35. The photodiode 30 is a PIN photodiode, for example.

The upper electrode 34 is coupled to a power supply signal line Lvs through coupling wiring 36. The power supply signal line Lvs is wiring that supplies the power supply potential SVS to the photodiode 30. In the first embodiment, the power supply signal line Lvs extends in the second direction Dy while overlapping the output signal line SLS. The light-receiving elements 3 arranged in the second direction Dy are coupled to the same power supply signal line Lvs. Such a configuration can enlarge an opening for the light-receiving element 3. The lower electrode 35, the semiconductor layer 31, and the upper electrode 34 are substantially quadrilateral in plan view. However, the shapes of the lower electrode 35, the semiconductor layer 31, and the upper electrode 34 are not limited thereto and can be changed as appropriate.

The first transistor Tr is provided near an intersection between the scan line GLS and the output signal line SLS. The first transistor Tr includes a semiconductor layer 61, a source electrode 62, a drain electrode 63, a first gate electrode 64A, and a second gate electrode 64B.

The semiconductor layer 61 is an oxide semiconductor. The semiconductor layer 61 is more preferably a transparent amorphous oxide semiconductor (TAOS) as one of the oxide semiconductors. Using an oxide semiconductor as the first transistor Tr can reduce a leakage current of the first transistor Tr. That is, the first transistor Tr can reduce the leakage current from the light-receiving element 3 that is not selected. Therefore, the detection device 1 can improve the signal-to-noise (S/N) ratio. The semiconductor layer 61 is, however, not limited to this material and may be, for example, a microcrystalline oxide semiconductor, an amorphous oxide semiconductor, polysilicon, or low-temperature polycrystalline silicon (LTPS).

The semiconductor layer 61 is provided along the first direction Dx and intersects the first and the second gate electrodes 64A and 64B in plan view. The first and the second gate electrodes 64A and 64B are provided so as to branch from the first and the second sensor gate lines GLA and GLB, respectively. In other words, portions of the first and the second scan lines GLA and GLB that overlap the semiconductor layer 61 serve as the first and the second gate electrodes 64A and 64B. Aluminum (Al), copper (Cu), silver (Ag), molybdenum (Mo), or an alloy of these metals is used as the first and the second gate electrodes 64A and 64B. Channel regions are formed at portions of the semiconductor layer 61 that overlap the first and the second gate electrodes 64A and 64B.

One end of the semiconductor layer 61 is coupled to the source electrode 62 through a contact hole H1. The other end of the semiconductor layer 61 is coupled to the drain electrode 63 through a contact hole H2. A portion of the output signal line SLS that overlaps the semiconductor layer 61 serves as the source electrode 62. A portion of a third conductive layer 67 that overlaps the semiconductor layer 61 serves as the drain electrode 63. The third conductive layer 67 is coupled to the lower electrode 35 through a contact hole H3. Such a configuration allows the first transistor Tr to switch between coupling and decoupling between the photodiode 30 and the output signal line SLS.

The arrangement pitch of the light-receiving elements 3 (photodiodes 30) in the first direction Dx is defined by the arrangement pitch of the output signal lines SLS in the first direction Dx. The arrangement pitch of the light-receiving element 3 (photodiode 30) in the second direction Dy is defined by the arrangement pitch of the scanning line GLS in the second direction Dy.

Figure 7:
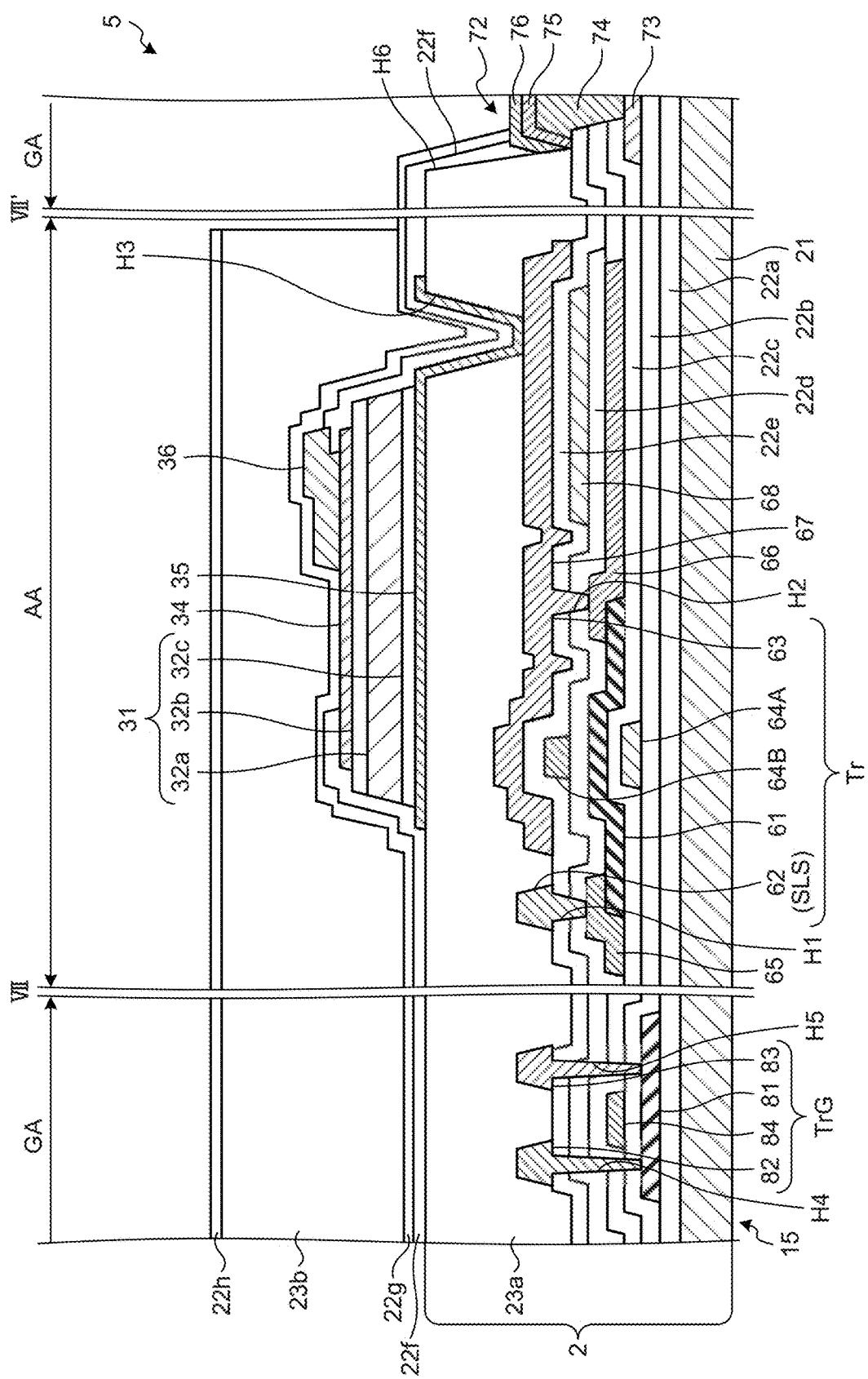
FIG. 7 is a sectional view along VII-VII' of FIG. 6.

The following describes a layer configuration of the optical sensor 5. FIG. 7 is a sectional view along VII-VII' of FIG. 6. In order to illustrate a relation between the layer structure of the detection area AA (refer to FIG. 3) and the layer structure of the peripheral area GA (refer to FIG. 3), FIG. 7 illustrates a section taken along a line VII-VII' and a section of a portion of the peripheral area GA that includes a second transistor TrG in a schematically connected manner. FIG. 7 further illustrates a section of a portion of the peripheral area GA that includes a terminal 72 in a schematically connected manner.

In the description of the optical sensor 5, a direction from the substrate 21 toward the photodiode 30 in a direction (third direction Dz) orthogonal to a surface of the substrate 21 is referred to as "upper side" or "above". A direction from the photodiode 30 toward the substrate 21 is referred to as "lower side" or "below". The term "plan view" refers to a positional relation as viewed in the direction orthogonal to the surface of the substrate 21.

As illustrated in FIG. 7, the substrate 21 is an insulating substrate, and is made using, for example, a glass substrate of quartz, alkali-free glass, and the like. The first transistors Tr, various types of wiring (the scan lines GLS and the output signal lines SLS), and insulating layers are provided to form the light-receiving element array substrate 2 on one surface of the substrate 21. The photodiodes 30 are arranged on the light-receiving element array substrate 2, that is, on the one surface side of the substrate 21. The substrate 21 may be a resin substrate or a resin film made of a resin such as polyimide.

Insulating layers 22a and 22b are provided on the substrate 21. The insulating layers 22a, 22b, 22c, and 22d, and insulating layers 22e, 22f, and 22g are inorganic insulating films of, for example, silicon oxide ($SiO_2$) or silicon nitride (SiN). Each of the inorganic insulating layers is not limited to a single layer and may be a multilayered film.

The first gate electrode 64A is provided on the insulating layer 22b. The insulating layer 22c is provided on the insulating layer 22b so as to cover the first gate electrode 64A. The semiconductor layer 61, a first conductive layer 65, and a second conductive layer 66 are provided on the insulating layer 22c. The first conductive layer 65 is provided so as to cover an end of the semiconductor layer 61 coupled to the source electrode 62. The second conductive layer 66 is provided so as to cover an end of the semiconductor layer 61 coupled to the drain electrode 63.

The insulating layer 22d is provided on the upper side of the insulating layer 22c so as to cover the semiconductor layer 61, the first conductive layer 65, and the second conductive layer 66. The second gate electrode 64B is provided on the insulating layer 22d. The semiconductor layer 61 is provided between the first gate electrode 64A and the second gate electrode 64B in the direction orthogonal to the substrate 21. That is, the first transistor Tr has what is called a dual-gate structure. The first transistor Tr may, however, have a bottom-gate structure that is provided with the first gate electrode 64A and not provided with the second gate electrode 64B, or a top-gate structure that is not provided with the first gate electrode 64A and provided with only the second gate electrode 64B.

The insulating layer 22e is provided on the upper side of the insulating layer 22d so as to cover the second gate electrode 64B. The source electrode 62 (output signal line SLS) and the drain electrode 63 (third conductive layer 67) are provided on the insulating layer 22e. In the first embodiment, the drain electrode 63 is the third conductive layer 67 provided above the semiconductor layer 61 with the insulating layers 22d and 22e interposed therebetween. The source electrode 62 is electrically coupled to the semiconductor layer 61 through the contact hole H1 and the first conductive layer 65. The drain electrode 63 is electrically coupled to the semiconductor layer 61 through the contact hole H2 and the second conductive layer 66.

The third conductive layer 67 is provided in an area overlapping the photodiode 30 in plan view. The third conductive layer 67 is provided also above the semiconductor layer 61 and the first and the second gate electrodes 64A and 64B. That is, the third conductive layer 67 is provided between the second gate electrode 64B and the lower electrode 35 in the direction orthogonal to the substrate 21. This configuration causes the third conductive layer 67 to serve as a protective layer that protects the first transistor Tr.

The second conductive layer 66 extends so as to face the third conductive layer 67 in an area not overlapping the semiconductor layer 61. A fourth conductive layer 68 is provided on the insulating layer 22d in an area not overlapping the semiconductor layer 61. The fourth conductive layer 68 is provided between the second conductive layer 66 and the third conductive layer 67. This configuration generates capacitance between the second conductive layer 66 and the fourth conductive layer 68, and capacitance between the third conductive layer 67 and the fourth conductive layer 68. The capacitance generated by the second conductive layer 66, the third conductive layer 67, and the fourth conductive layer 68 serves as capacitance of the capacitive element Ca illustrated in FIG. 5.

A first organic insulating layer 23a is provided on the insulating layer 22e so as to cover the source electrode 62 (output signal line SLS) and the drain electrode 63 (third conductive layer 67). The first organic insulating layer 23a is a planarizing layer that planarizes asperities formed by the first transistor Tr and various conductive layers.

The following describes a sectional configuration of the photodiode 30. In the photodiode 30, the lower electrode 35, the semiconductor layer 31, and the upper electrode 34 are stacked in this order on the first organic insulating layer 23a of the light-receiving element array substrate 2. The light-receiving element array substrate 2 is a drive circuit substrate that drives the sensor for each predetermined detection area. The light-receiving element array substrate 2 includes the substrate 21 and, for example, the first transistor Tr, the second transistor TrG, and the various types of wiring provided on the substrate 21.

The lower electrode 35 is provided on the first organic insulating layer 23a and electrically coupled to the third conductive layer 67 through the contact hole H3. The lower electrode 35 is the anode of the photodiode 30 and is an electrode for reading the detection signal Vdet. For example, a metal material such as molybdenum (Mo) or aluminum (Al) is used as the lower electrode 35. The lower electrode 35 may alternatively be a multilayered film formed of a plurality of layers of these metal materials. The lower electrode 35 may be formed of a light-transmitting conductive material such as indium tin oxide (ITO) or indium zinc oxide (IZO).

The semiconductor layer 31 is formed of amorphous silicon (a-Si). The semiconductor layer 31 includes an i-type semiconductor layer 32a, an n-type semiconductor layer 32b, and a p-type semiconductor layer 32c. The i-type semiconductor layer 32a, the n-type semiconductor layer 32b, and the p-type semiconductor layer 32c form a specific example of a photoelectric conversion element. In FIG. 7, the p-type semiconductor layer 32c, the i-type semiconductor layer 32a, and the n-type semiconductor layer 32b are stacked in this order in the direction orthogonal to the surface of the substrate 21. However, the semiconductor layer 31 may have a reversed configuration. That is, the n-type semiconductor layer 32b, the i-type semiconductor layer 32a, and the p-type semiconductor layer 32c may be stacked in this order. The semiconductor layer 31 may be a photoelectric conversion element formed of organic semiconductors.

The a-Si of the n-type semiconductor layer 32b is doped with impurities to form an n+ region therein. The a-Si of the p-type semiconductor layer 32c is doped with impurities to form a p+ region therein. The i-type semiconductor layer 32a is, for example, a non-doped intrinsic semiconductor and has lower conductivity than that of the n-type semiconductor layer 32b and the p-type semiconductor layer 32c.

The upper electrode 34 is the cathode of the photodiode 30 and is an electrode for supplying the power supply potential SVS to the photoelectric conversion layer. The upper electrode 34 is, for example, a light-transmitting conductive layer of, for example, ITO, and a plurality of the upper electrodes 34 are provided for the respective photodiodes 30.

The insulating layers 22f and 22g are provided on the first organic insulating layer 23a. The insulating layer 22f covers the periphery of the upper electrode 34 and is provided with an opening in a position overlapping the upper electrode 34. The coupling wiring 36 is coupled to the upper electrode 34 at a portion of the upper electrode 34 where the insulating layer 22f is not provided. The insulating layer 22g is provided on the insulating layer 22f so as to cover the upper electrode 34 and the coupling wiring 36. A second organic insulating layer 23b serving as a planarizing layer is provided on the insulating layer 22g. In the case of the organic semiconductor photodiode, an insulating layer 22h may be further provided thereon.

The second transistor TrG of the scan line drive circuit 15 is provided in the peripheral area GA. The second transistor TrG is provided on the substrate 21 on which the first transistor Tr is provided. The second transistor TrG includes a semiconductor layer 81, a source electrode 82, a drain electrode 83, and a gate electrode 84.

The semiconductor layer 81 is polysilicon. The semiconductor layer 81 is more preferably low-temperature polysilicon (LTPS). The semiconductor layer 81 is provided on the insulating layer 22a. That is, the semiconductor layer 61 of the first transistor Tr is provided in a position farther from the substrate 21 than the semiconductor layer 81 of the second transistor TrG is, in the direction orthogonal to the substrate 21. However, the semiconductor layer 81 is not limited to this configuration and may be formed in the same layer and of the same material as that of the semiconductor layer 61.

The gate electrode 84 is provided on the upper side of the semiconductor layer 81 with the insulating layer 22b interposed therebetween. The gate electrode 84 is provided in the same layer as the first gate electrode 64A. The second transistor TrG has what is called a top-gate structure. However, the second transistor TrG may have a dual-gate structure or a bottom-gate structure.

The source electrode 82 and the drain electrode 83 are provided on the insulating layer 22e. The source electrode 82 and the drain electrode 83 are provided in the same layer as the source electrode 62 and the drain electrode 63 of the first transistor Tr. Contact holes H4 and H5 are provided penetrating the insulating layers 22b to 22e. The source electrode 82 is electrically coupled to the semiconductor layer 81 through the contact hole H4. The drain electrode 83 is electrically coupled to the semiconductor layer 81 through the contact hole H5.

The terminal 72 is provided in a position of the peripheral area GA different from the area where the scan line drive circuit 15 is provided. The terminal 72 includes a first terminal conductive layer 73, a second terminal conductive layer 74, a third terminal conductive layer 75, and a fourth terminal conductive layer 76. The first terminal conductive layer 73 is provided in the same layer as the first gate electrode 64A on the insulating layer 22b. A contact hole H6 is provided so as to continue through the insulating layers 22c, 22d, 22e and the first organic insulating layer 23a.

The second terminal conductive layer 74, the third terminal conductive layer 75, and the fourth terminal conductive layer 76 are stacked in this order in the contact hole H6 and electrically coupled to the first terminal conductive layer 73. The second terminal conductive layer 74 can be formed using the same material and the same process as those of the third conductive layer 67, for example. The third terminal conductive layer 75 can be formed using the same material and the same process as those of the lower electrode 35. The fourth terminal conductive layer 76 can be formed using the same material and the same process as those of the coupling wiring 36 and the power supply signal line Lvs (refer to FIG. 6).

While FIG. 7 illustrates one terminal 72, a plurality of the terminals 72 are arranged at intervals. The terminals 72 are electrically coupled to the wiring substrate 510 (refer to FIG. 3) by an anisotropic conductive film (ACF), for example.

The optical sensor 5 is not limited to the structure described above as long as the photodiode 30 can detect light. The optical sensor 5 may detect information other than the information on the fingerprint as long as the optical sensor 5 receives the light using the photodiode 30 and detects the information.

Figure 8:
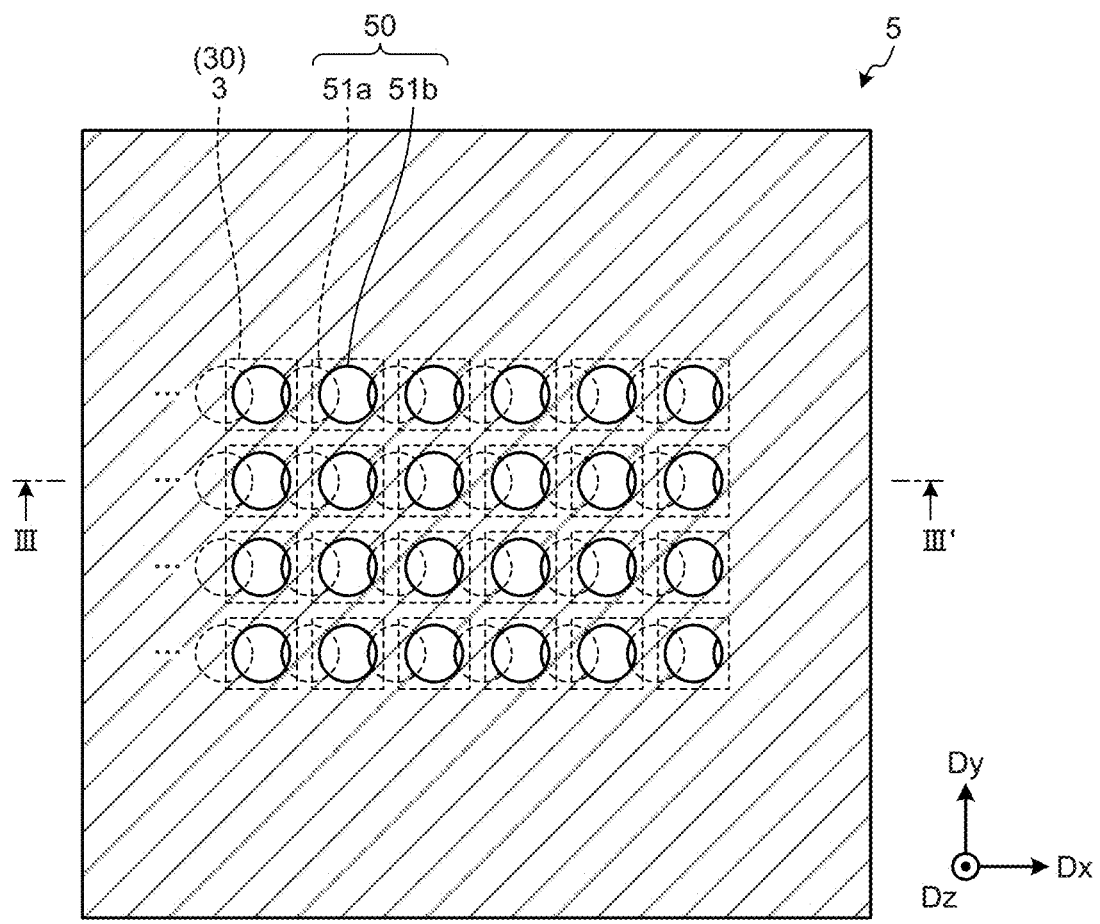
FIG. 8 is a plan view schematically illustrating an arrangement relation between first openings and second openings of light guide paths according to the first embodiment.

FIG. 8 is a plan view schematically illustrating an arrangement relation between first openings and second openings of the light guide paths according to the first embodiment.

FIG. 8 is a partially enlarged plan view of a portion of the optical filter layer 50 viewed in the third direction Dz (light guide plate LG side), and the positions of second openings 51a of the light guide paths 51 with respect to the light-receiving elements 3 in plan view are each indicated by a dotted line. In the first embodiment, a first opening 51b and the second opening 51a have the same area in plan view.

As illustrated in FIG. 8, the optical filter layer 50 includes the light guide paths 51 and the light-blocking portion 55. The light guide paths 51 are arranged in the first direction Dx and the second direction Dy and provided in a matrix having a row-column configuration. Each of the light guide paths 51 can transmit the light (refer to FIG. 2). The absorptance of the light by the light-blocking portion 55 is higher than absorptance of the light by the light guide paths 51. In other words, the transmittance of the light through the light guide paths 51 is higher than the transmittance of the light through the light-blocking portion 55.

The light-blocking portion 55 is provided around the light guide paths 51 and made of a member that is difficult to transmit light. The absorptance of the light by the light-blocking portion 55 is preferably from 99% to 100%, and more preferably 100%. The absorptance of the light herein refers to (Lin−Lout)/Lin that is the ratio of the difference between the intensity of incoming light Lin and the intensity of outgoing light out, to the intensity of the incoming light Lin.

The second openings 51a of the light guide paths 51 illustrated in FIG. 8 are located on a second surface that emits light toward the light-receiving elements 3. As illustrated in FIG. 8, the second openings 51a are arranged to be offset in the first direction Dx from the first openings 51b, respectively. The first openings 51b of the light guide paths 51 are provided so as to overlap the light-receiving elements 3, thus being capable of accurately emitting the light to the light-receiving elements 3.

As illustrated in FIGS. 2 and 8, the optical filter layer 50 has a surface having the second openings 51a and a surface having the first openings 51b on the opposite side of the surface having the second openings 51a. As illustrated in FIG. 8, the first openings 51b of the optical filter layer 50 face the light-receiving elements 3.

Figure 9:
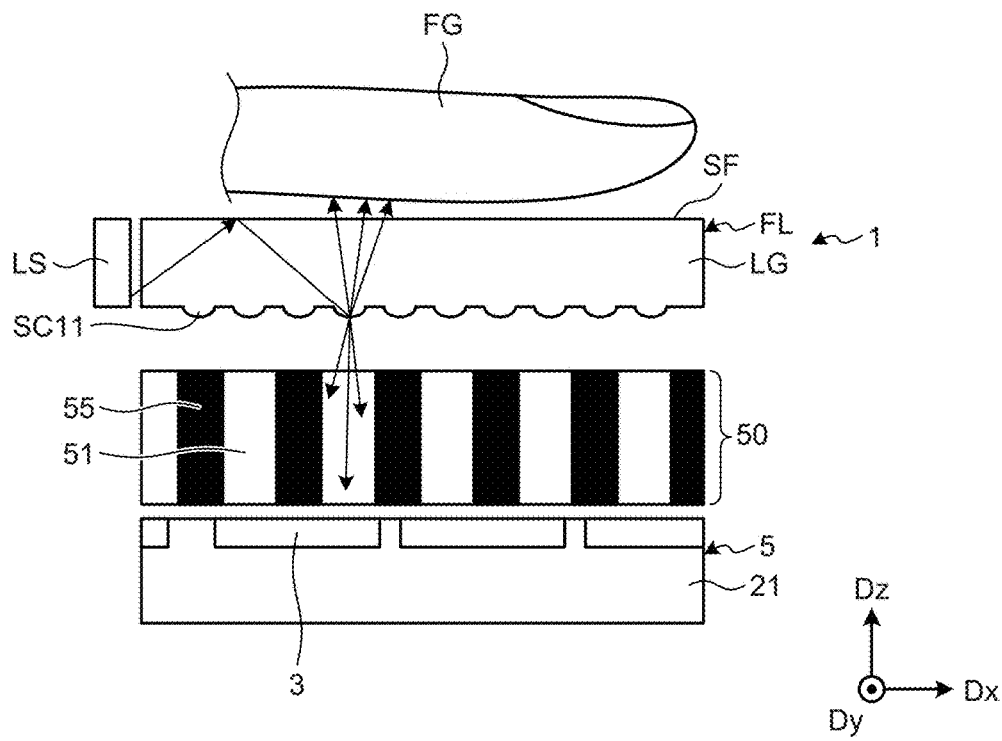
FIG. 9 is a sectional view schematically illustrating a section of the detection device according to a comparative example.

FIG. 9 is a sectional view schematically illustrating a section of the detection device according to a comparative example. The light guide paths 51 of the comparison example are parallel to the third direction Dz. With the light guide paths according to the comparative example, outside light as well as the light reflected by the object to be detected FG can easily reach the light-receiving elements 3. In contrast, in the first embodiment, when viewed in the third direction Dz, the first opening 51b of the light guide path 51 closest to the photodiode 30 of the light-receiving element 3 overlaps the photodiode 30 of the light-receiving element 3, and the second opening 51a of the light guide path 51 farthest from the photodiode 30 of the light-receiving element 3 is offset in the first direction Dx from the first opening 51b. With this configuration, the light reflected by the object to be detected FG is selected and easily reaches the light-receiving element 3. As a result, noise of the photodiode 30 is reduced, and the sensing sensitivity is improved. The second opening 51a of the light guide path 51 preferably does not overlap the first opening 51b.

Figure 10:
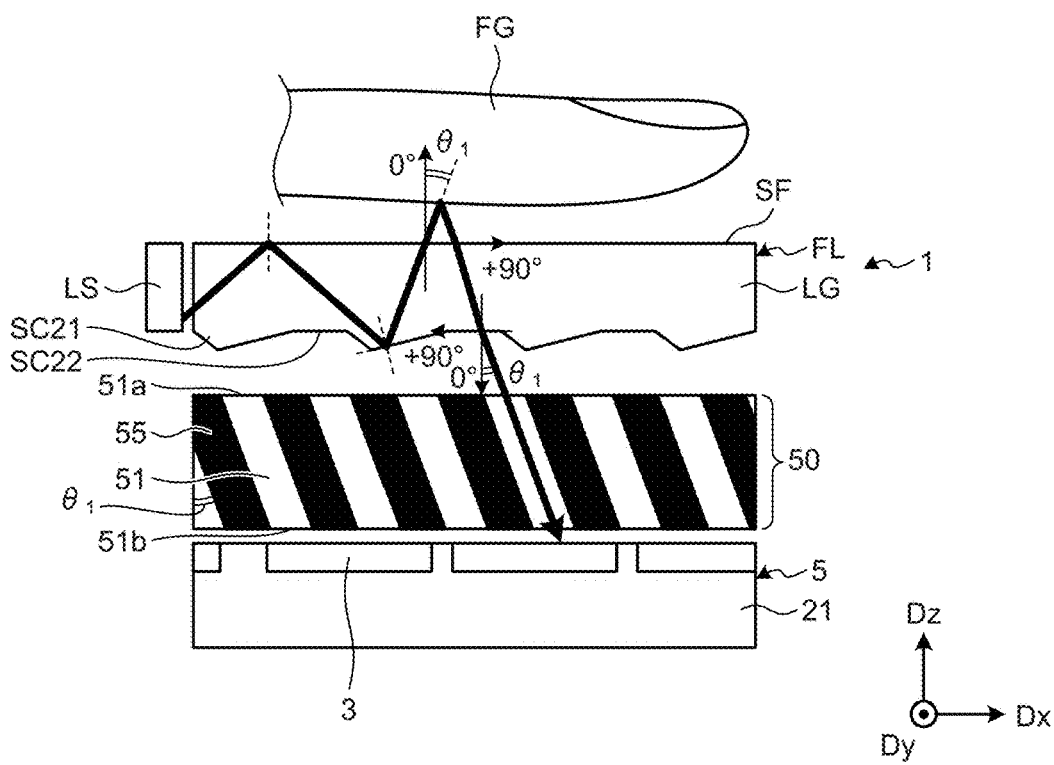
FIG. 10 is a sectional view schematically illustrating a section of another detection device according to the first embodiment.
Figure 11:
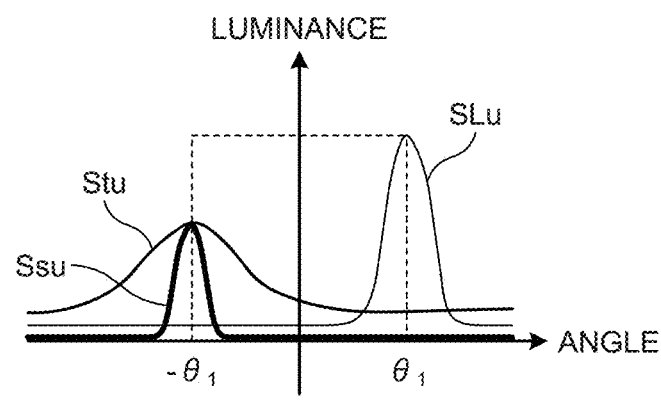
FIG. 11 is an explanatory diagram for explaining a relation between a distribution of luminance from a light guide plate to the light-receiving element and a distribution of luminance from the light guide plate to an object to be detected.

FIG. 10 is a sectional view schematically illustrating a section of another detection device according to the first embodiment. FIG. 11 is an explanatory diagram for explaining a relation between a distribution of luminance from the light guide plate to the light-receiving element and a distribution of luminance from the light guide plate to the object to be detected. At the scattering portion SC11 described above, light is isotropically scattered. As a result, some light may enter the light guide path 51 from the light guide plate LG, which can cause a reduction in contrast of the light detected by the light-receiving element 3.

Therefore, in the first embodiment, as illustrated in FIG. 10, a scattering portion SC21 is a projecting or recessed portion having a triangular shape in sectional view. A plurality of the scattering portions SC21 are arranged, and a back emission surface SC22 parallel to the detection surface SF is provided between the adjacent scattering portions SC21 and SC21. The back emission surface SC22 and the second opening 51a are arranged so as to be aligned on an extended line in the direction of extension of the light guide path 51.

FIG. 11 is an explanatory diagram for explaining a relation between a distribution of luminance from the light guide plate to the light-receiving element and a distribution of luminance from the light guide plate to the object to be detected. In the detection device 1 illustrated in FIG. 10, as illustrated in FIG. 11, in first light SLu that has a first peak and a first distribution and is emitted from the detection surface SF of the light guide plate LG toward the object to be detected FG, the first peak is observed to be tilted at an angle $\theta_1$ with respect to a direction normal to the detection surface SF. As illustrated in FIG. 10, the first peak of the intensity of the first light SLu is observed to be tilted toward a side opposite to the side surface of the light guide plate LG where the light source LS is located.

As illustrated in FIG. 11, in second light Stu that has a second peak and a second distribution and is emitted from the back emission surface SC22, the second peak is observed in a direction opposite to the direction in which the first peak of the intensity of the first light SLu is observed with respect to the third direction Dz illustrated in FIG. 10. The second peak of the intensity of the second light Stu is observed to be tilted at an angle $-\theta_1$ with respect to the direction normal to the detection surface SF.

The light guide paths 51 are also called light guide columns and extend each from a first surface provided with the first opening 51b to a second surface provided with the second opening 51a while being tilted at the angle $\theta_1$ with respect to the third direction Dz. That is, the second openings 51a of the light guide paths 51 are offset in the first direction Dx from the first openings 51b of the optical filter layer 50. As a result, as illustrated in FIG. 11, the light-receiving elements 3 detect third light Ssu having a third peak and a third distribution narrower than the second distribution of the second light Stu, thus improving the detection accuracy. The angle between the third direction and the direction of extension of the light guide paths is preferably equal to the angle between the third direction and the direction in which the first peak of the intensity of the first light SLu emitted from the detection surface SF of the light guide plate LG is observed. This configuration improves the detection sensitivity of the light-receiving elements 3.

Second Embodiment

Figure 12:
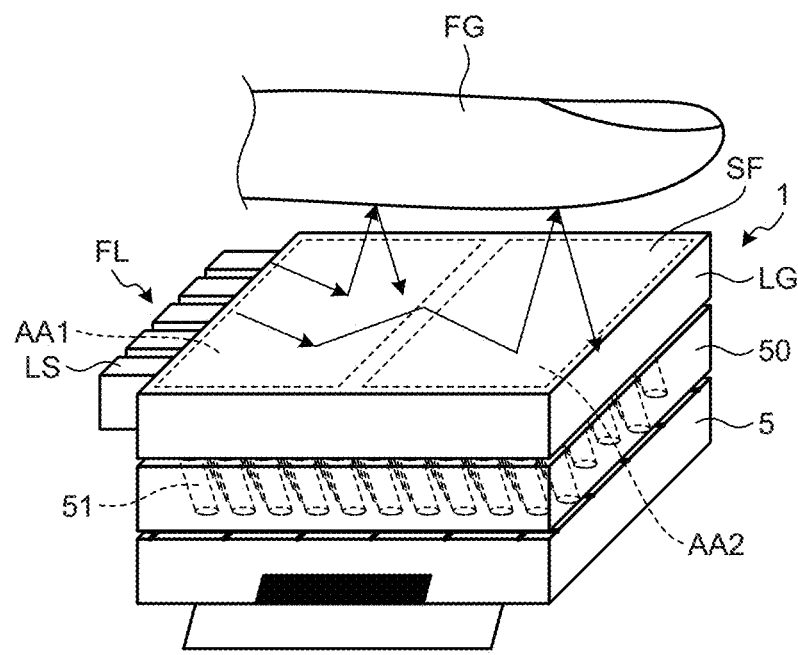
FIG. 12 is a perspective view schematically illustrating the detection device according to a second embodiment of the present disclosure.
Figure 13:
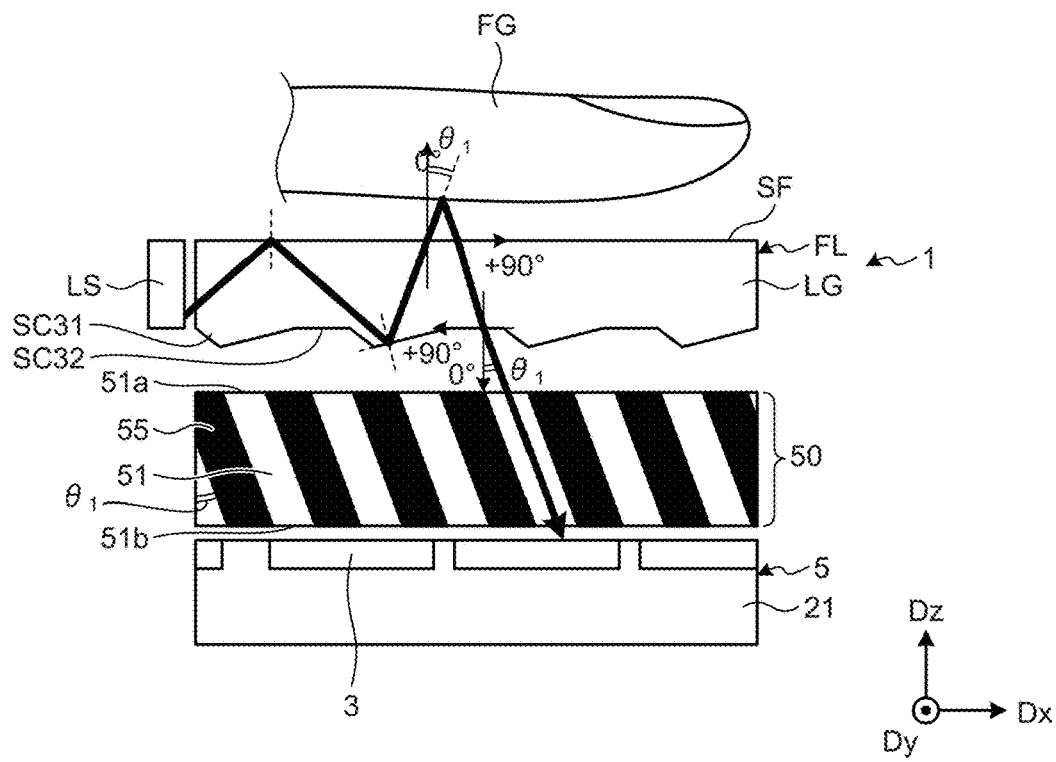
FIG. 13 is a sectional view schematically illustrating a section of a first detection area of the detection device according to the second embodiment.
Figure 14:
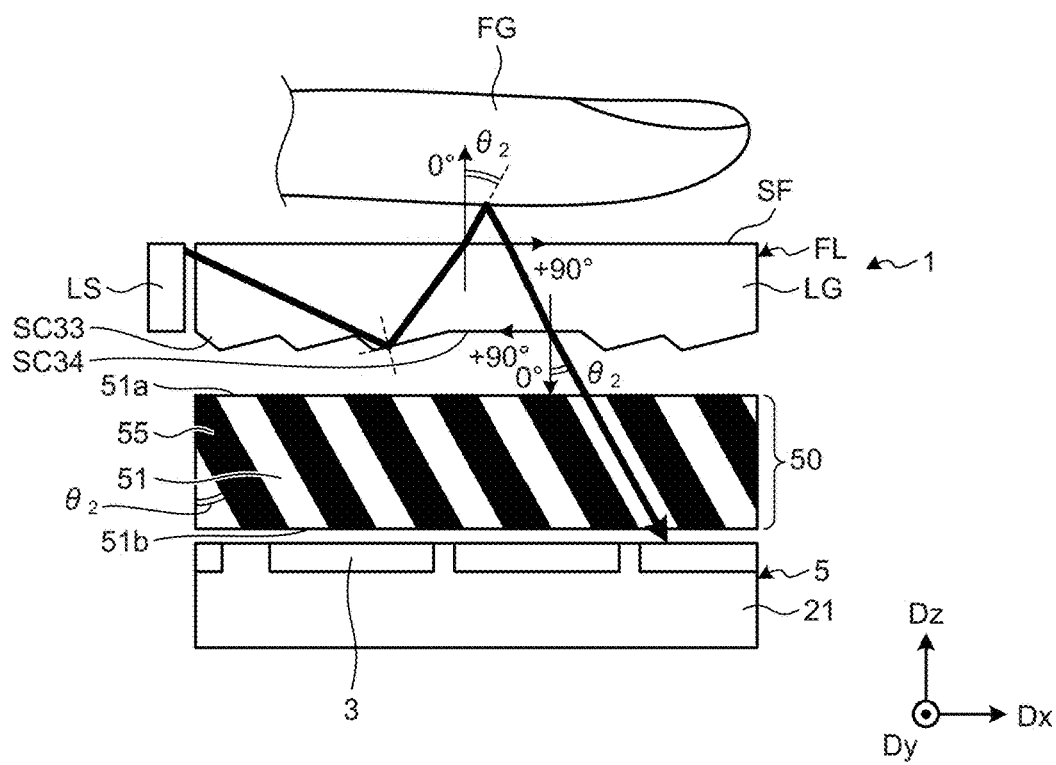
FIG. 14 is a sectional view schematically illustrating a section of a second detection area of the detection device according to the second embodiment.
Figure 15:
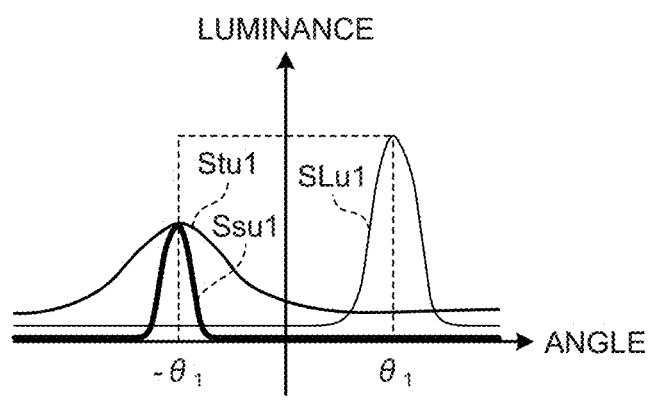
FIG. 15 is an explanatory diagram for explaining the relation between the distribution of luminance from the light guide plate to the light-receiving element and the distribution of luminance from the light guide plate to the object to be detected, in the first detection area of the second embodiment.
Figure 16:
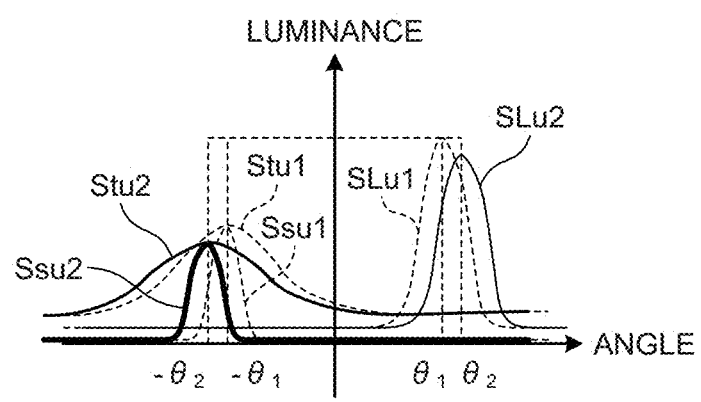
FIG. 16 is an explanatory diagram for explaining the relation between the distribution of luminance from the light guide plate to the light-receiving element and the distribution of luminance from the light guide plate to the object to be detected, in the second detection area of the second embodiment.

FIG. 12 is a perspective view schematically illustrating the detection device according to a second embodiment of the present disclosure. FIG. 13 is a sectional view schematically illustrating a section of a first detection area of the detection device according to the second embodiment. FIG. 14 is a sectional view schematically illustrating a section of a second detection area of the detection device according to the second embodiment. FIG. 15 is an explanatory diagram for explaining the relation between the distribution of luminance from the light guide plate to the light-receiving element and the distribution of luminance from the light guide plate to the object to be detected, in the first detection area of the second embodiment. FIG. 16 is an explanatory diagram for explaining the relation between the distribution of luminance from the light guide plate to the light-receiving element and the distribution of luminance from the light guide plate to the object to be detected, in the second detection area of the second embodiment. The same structure as that in the first embodiment is denoted by the same reference numeral and will not be described in detail.

As illustrated in FIG. 12, the detection surface SF has a first detection area AA1 and a second detection area AA2 in order of proximity to the light source LS. By providing the scattering portion SC21, the first peak of the intensity of the first light SLu is observed to be tilted toward the side opposite to the side surface of the light guide plate LG where the light source LS is located. From propagation characteristics of the light in the light guide plate LG, the tilt of the first light with respect to the third direction Dz has been found to increase with distance from the light source LS.

For example, as illustrated in FIG. 13, in the section of the first detection area AA1, a scattering portion SC31 is a projecting or recessed portion having a triangular shape in sectional view. A plurality of the scattering portions SC31 are arranged, and a back emission surface SC32 parallel to the detection surface SF is provided between the adjacent scattering portions SC31 and SC31. The back emission surface SC32 and the second opening 51a are arranged so as to be aligned on an extended line in the direction of extension of the light guide path 51. As illustrated in FIG. 15, first light SLu1 that has the first peak and the first distribution and is emitted from the detection surface SF of the light guide plate LG toward the object to be detected FG is observed to be tilted at the angle $\theta_1$ with respect to the direction normal to the detection surface SF. In second light Stu1 that has the second peak and the second distribution and is emitted from the back emission surface SC32, the second peak is observed in a direction opposite to the direction in which the first peak is observed with respect to the third direction Dz. As illustrated in FIG. 15, the first peak of the intensity of the first light SLu1 is observed to be tilted toward the side opposite to the side surface of the light guide plate LG where the light source LS is located. The light-receiving elements 3 detect third light Ssu1 having the third peak and the third distribution narrower than the second distribution of the second light Stu1, thus improving the detection accuracy.

For example, as illustrated in FIG. 14, in the section of the second detection area AA2, a scattering portion SC33 is a projecting or recessed portion having a triangular shape in sectional view. A plurality of the scattering portions SC33 are arranged, and a back emission surface SC34 parallel to the detection surface SF is provided between the adjacent scattering portions SC33 and SC33. The back emission surface SC34 and the second opening 51a are arranged so as to be aligned on an extended line in the direction of extension of the light guide path 51. The number of the scattering portions SC33 overlapping the second detection area AA2 is larger than the number of the scattering portions SC31 overlapping the first detection area AA1. As illustrated in FIG. 16, first light SLu2 that has the first peak and the first distribution and is emitted from the detection surface SF of the light guide plate LG toward the object to be detected FG is observed to be tilted at an angle $\theta_2$ with respect to the direction normal to the detection surface SF. In second light Stu2 that has the second peak and the second distribution and is emitted from the back emission surface SC32, the second peak is observed in a direction opposite to the direction in which the first peak is observed with respect to the third direction Dz. As illustrated in FIG. 16, the first peak of the intensity of the first light SLu2 is observed to be tilted toward the side opposite to the side surface of the light guide plate LG where the light source LS is located. The light-receiving elements 3 detect third light Ssu2 having the third peak and the third distribution narrower than the second distribution of the second light Stu2, thus improving the detection accuracy. The intensity of the first peak of the first light SLu2 is smaller than the intensity of the first peak of the first light SLu1.

Therefore, in the second embodiment, the second angle $\theta_2$ between the third direction Dz and the direction of extension of the light guide path 51 overlapping the second detection area AA2 is set larger than the first angle $\theta_1$ between the third direction Dz and the direction of extension of the light guide path 51 overlapping the first detection area AA1. This configuration increases the amount of light passing through the light guide path 51 and reduces the in-plane variation of detection values on the detection surface SF.

While the description has been made by exemplifying the first detection area AA1 and the second detection area AA2, the angle between the third direction Dz and the direction of extension of the light guide path 51 may be gradually increased further away from the light source LS.

First Modification of Second Embodiment

Figure 17:
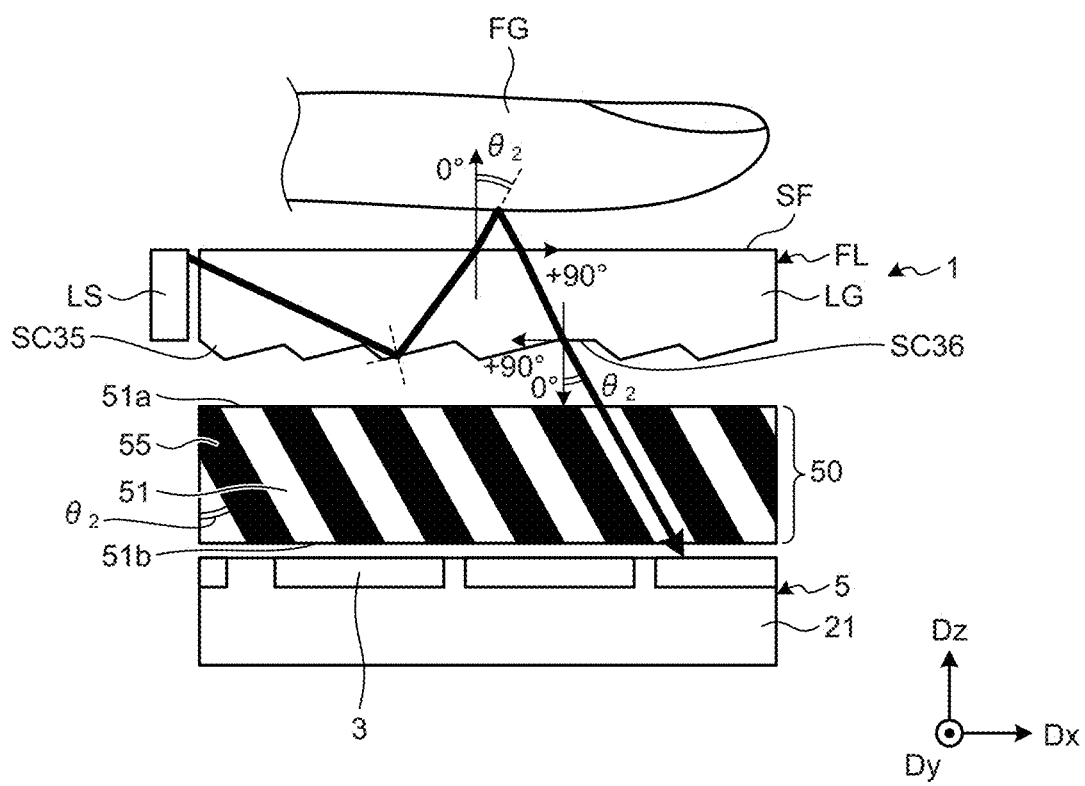
FIG. 17 is a sectional view schematically illustrating a section of the second detection area of the detection device according to a first modification of the second embodiment.

FIG. 17 is a sectional view schematically illustrating a section of the second detection area of the detection device according to a first modification of the second embodiment. The same structure as that in either of the first and the second embodiments is denoted by the same reference numeral and will not be described in detail.

The first detection area AA1 is the same as that of the second embodiment, and therefore, will not be described. For example, as illustrated in FIG. 17, in the section of the second detection area AA2, a scattering portion SC35 is a projecting or recessed portion having a triangular shape in sectional view. A plurality of the scattering portions SC35 are arranged, and a back emission surface SC36 parallel to the detection surface SF is provided between the adjacent scattering portions SC35 and SC35. The back emission surface SC36 and the second opening 51a are arranged so as to be aligned on an extended line in the direction of extension of the light guide path 51. The number of the scattering portions SC35 overlapping the second detection area AA2 is larger than the number of the scattering portions SC31 overlapping the first detection area AA1. The number of the scattering portions SC35 overlapping the second detection area AA2 is larger than the number of the scattering portions SC33 overlapping the second detection area AA2 illustrated in FIG. 14. This configuration increases the amount of light scattered by the scattering portions SC35.

Figure 18:
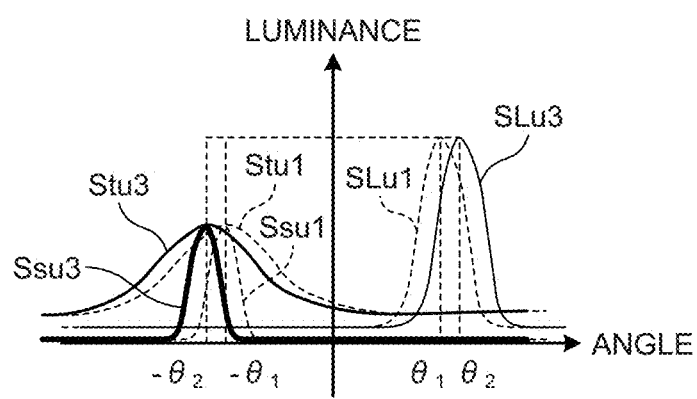
FIG. 18 is an explanatory diagram for explaining the relation between the distribution of luminance from the light guide plate to the light-receiving element and the distribution of luminance from the light guide plate to the object to be detected, in the second detection area of the first modification of the second embodiment.

As illustrated in FIG. 18, first light SLu3 that has the first peak and the first distribution and is emitted from the detection surface SF of the light guide plate LG toward the object to be detected FG is observed to be tilted at the angle $\theta_2$ with respect to the direction normal to the detection surface SF. In second light Stu3 that has the second peak and the second distribution and is emitted from the back emission surface SC36, the second peak is observed in a direction opposite to the direction in which the first peak is observed with respect to the third direction Dz. As illustrated in FIG. 18, the first peak of the intensity of the first light SLu3 is observed to be tilted toward the side opposite to the side surface of the light guide plate LG where the light source LS is located. The light-receiving elements 3 detect third light Ssu3 having the third peak and the third distribution narrower than the second distribution of the second light Stu3, thus improving the detection accuracy. The intensity of the first peak of the first light SLu3 is comparable with the intensity of the first peak of the first light SLu1. As a result, the detection sensitivity to the third light Ssu1 is made comparable with that to the third light Ssu3.

While the description has been made by exemplifying the first detection area AA1 and the second detection area AA2, the number of the scattering portions may be gradually increased further away from the light source LS.

Second Modification of Second Embodiment

Figure 19:
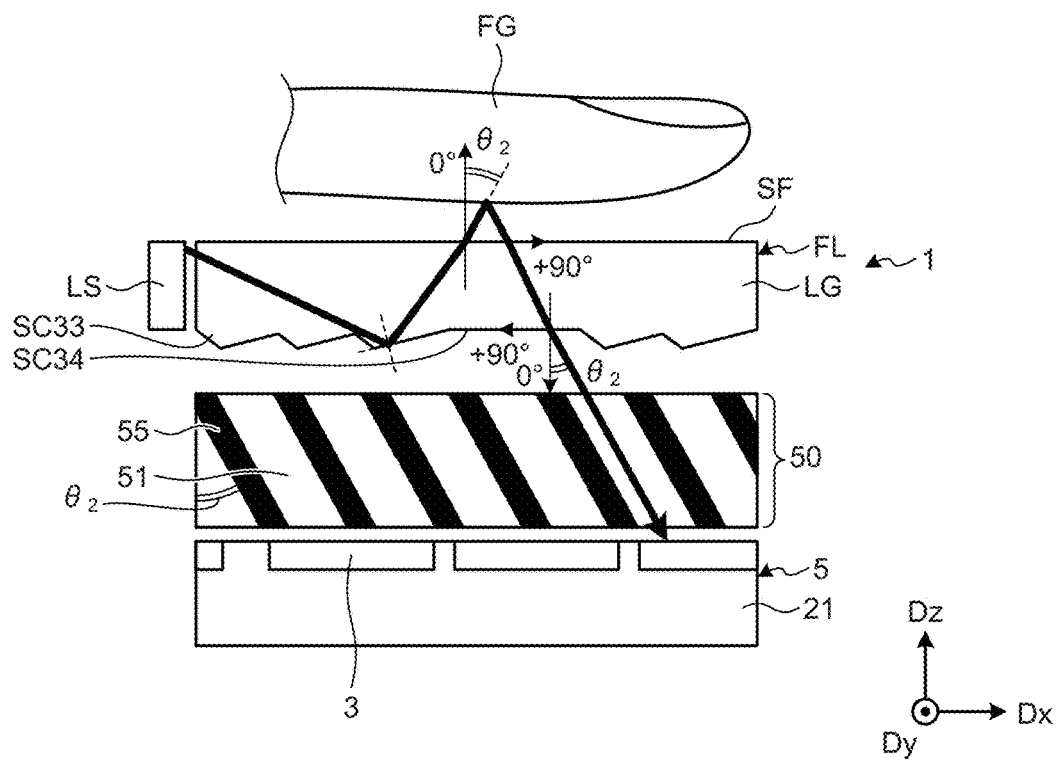
FIG. 19 is a sectional view schematically illustrating a section of the second detection area of the detection device according to a second modification of the second embodiment.

FIG. 19 is a sectional view schematically illustrating a section of the second detection area of the detection device according to a second modification of the second embodiment. The same structure as that in any one of the first embodiment, the second embodiment, and the first modification of the second embodiment is denoted by the same reference numeral and will not be described in detail.

The first detection area AA1 is the same as that of the second embodiment, and therefore, will not be described. As illustrated in FIG. 19, the transmittance of the optical filter layer 50 overlapping the second detection area AA2 is larger than that of the optical filter layer 50 overlapping the first detection area AA1. For example, as viewed in the third direction Dz, the area in the Dx-Dy section of the light guide path 51 overlapping the second detection area AA2 (refer to FIG. 19) is set larger than the area of the light guide path 51 overlapping the first detection area AA1 (refer to FIG. 13).

The second modification of the second embodiment provides the same operational advantages as those of the first modification of the second embodiment. While the description has been made by exemplifying the first detection area AA1 and the second detection area AA2, the transmittance of the optical filter layer 50 may be gradually increased further away from the light source LS.

Third Embodiment

Figure 20:
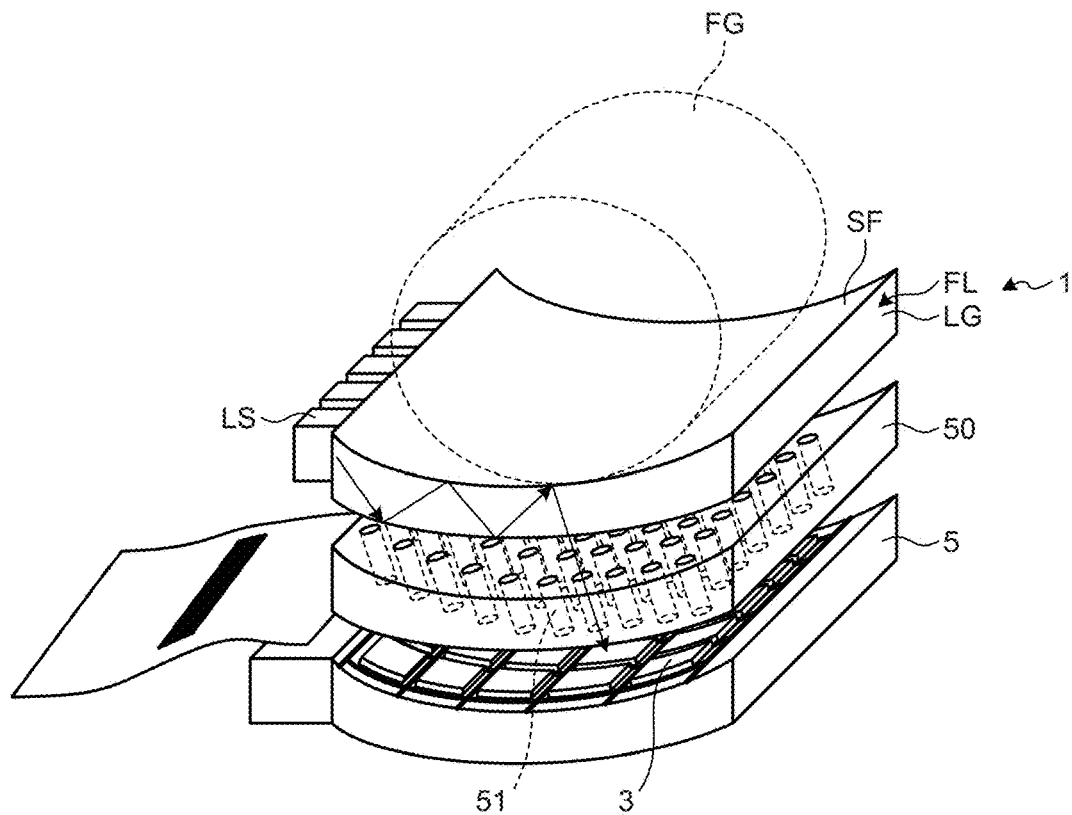
FIG. 20 is a perspective view schematically illustrating the detection device according to a third embodiment of the present disclosure.

FIG. 20 is a perspective view schematically illustrating the detection device according to a third embodiment of the present disclosure. FIG. 21 is a sectional view schematically illustrating a section of the detection device according to the third embodiment. The same structure as that in any one of the first embodiment, the second embodiment, and the modifications of the second embodiment is denoted by the same reference numeral and will not be described in detail.

In the detection device 1 according to the third embodiment, the light guide plate LG is curved as illustrated in FIG. 20. The light-receiving element array substrate 2 (substrate 21) is made of a resin and is a flexible substrate having flexibility. The flexible light-receiving element array substrate 2 (substrate 21) is curved along the curvature of the light guide plate LG.

The object to be detected FG is, for example, an arm or a foot, and the front light FL can be along the shape of the object to be detected FG and pressed against thereto.

As illustrated in FIG. 21, the flexible light-receiving element array substrate 2 (substrate 21) is curved along the curvature of the light guide plate LG, so that the radius of curvature of the light guide plate LG centered on a virtual center Ax is substantially the same as the radius of curvature of the flexible light-receiving element array substrate 2 (substrate 21).

A scattering portion SC41 is a projecting or recessed portion having a triangular shape in sectional view. A plurality of the scattering portions SC41 are arranged, and a back emission surface SC42 curved in the same manner as the detection surface SF is provided between the adjacent scattering portions SC41 and SC41. The back emission surface SC42 and the second opening 51a are arranged so as to be aligned on an extended line in the direction of extension of the light guide path 51.

While the preferred embodiments of the present disclosure have been described above, the present disclosure is not limited to the embodiments described above. The content disclosed in the embodiments is merely an example, and can be variously modified within the scope not departing from the gist of the present disclosure. Any modifications appropriately made within the scope not departing from the gist of the present disclosure also naturally belong to the technical scope of the present disclosure.

For example, in the embodiments herein, the examples have been described in which the offset direction of the second opening 51a from the first opening 51b is the first direction Dx, but the offset direction of the second opening 51a from the first opening 51b can be any direction in the Dx-Dy plane.

The optical filter layer 50 may be in the form of pinholes where the light-blocking portion 55 is intermittently provided in the thickness direction and the light guide paths 51 are scattered. Microlenses may overlap the light guide paths 51.

What is claimed is:

1. A detection device comprising:
    a photosensor comprising a plurality of light-receiving elements configured to receive light;
    a front light that is disposed on a side of an object to be detected with respect to the photosensor and comprises a light guide plate and a light source configured to emit light to a first side surface of the light guide plate; and
    an optical filter layer that is provided between the light-receiving elements and the front light, wherein
    the optical filter layer comprises light guide paths that at least partially overlap the light-receiving elements and a light-blocking portion that has higher absorptance of the light than the light guide paths,
    when viewed from a detection surface of the light guide plate facing the object to be detected, a first opening of each of the light guide paths closest to the light-receiving elements is offset in a direction more away from the light source than a second opening of the light guide path farthest from the light-receiving elements,
    the light guide plate comprises a scattering portion configured to scatter the light from the light source on the optical filter layer side, and
    when viewed in a normal direction to the detection surface of the light guide plate, a first peak of an intensity of first light emitted from the detection surface of the light guide plate is observed to be tilted toward a side opposite to the first side surface.

2. The detection device according to claim 1, wherein an angle between the normal direction and a direction in which the first peak of the intensity of the first light is observed is opposite to an angle between the normal direction and a direction in which a second peak of an intensity of second light emitted from the light guide plate to a back surface opposite to the detection surface is observed.

3. The detection device according to claim 1, wherein the scattering portion is a projecting or recessed portion having a triangular shape in sectional view.

4. The detection device according to claim 3, wherein a plurality of the scattering portions are arranged, and a back emission surface parallel to the detection surface is provided between the scattering portions.

5. The detection device according to claim 4, wherein the back emission surface and the second opening are arranged so as to be aligned on an extended line in a direction of extension of the light guide path.

6. The detection device according to claim 1, wherein an angle between the normal direction and a direction in which the first peak of the intensity of the first light is observed is equal to an angle between the normal direction and a direction of extension of the light guide path.

7. The detection device according to claim 1, comprising a first detection area of the light guide plate and a second detection area farther than the first detection area from the light source when viewed in the normal direction, wherein an angle between the normal direction and a direction of extension of each light guide path varies depending on location of the light guide path, and a second angle between the normal direction and the direction of extension of the light guide path overlapping the second detection area is larger than a first angle between the normal direction and the direction of extension of the light guide path overlapping the first detection area.

8. The detection device according to claim 1, comprising a first detection area of the light guide plate and a second detection area farther than the first detection area from the light source when viewed in the normal direction, wherein transmittance of the optical filter layer overlapping the second detection area is larger than that of the optical filter layer overlapping the first detection area.

9. The detection device according to claim 1, comprising a first detection area of the light guide plate and a second detection area farther than the first detection area from the light source when viewed in the direction normal to the light guide plate, wherein an area of the light guide path overlapping the second detection area is larger than that of the light guide path overlapping the first detection area when viewed in the normal direction.

10. The detection device according to claim 1, comprising a first detection area of the light guide plate and a second detection area farther than the first detection area from the light source when viewed in the direction normal to the light guide plate, wherein the number of the scattering portions overlapping the second detection area is larger than that of the scattering portions overlapping the first detection area when viewed in the normal direction.

11. The detection device according to claim 1, wherein the light-receiving elements are provided on a flexible substrate, the light guide plate is curved, and the flexible substrate is curved along the curvature of the light guide plate.

* * * * *